United States Patent
Wang et al.

(10) Patent No.: US 8,570,761 B2
(45) Date of Patent: Oct. 29, 2013

(54) LIQUID CRYSTAL DISPLAY MODULE AND LIQUID CRYSTAL PANEL

(75) Inventors: JinJie Wang, Shenzhen (CN); Chenghung Chen, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 162 days.

(21) Appl. No.: 13/318,342

(22) PCT Filed: Sep. 21, 2011

(86) PCT No.: PCT/CN2011/079964
§ 371 (c)(1),
(2), (4) Date: Oct. 31, 2011

(87) PCT Pub. No.: WO2013/033935
PCT Pub. Date: Mar. 14, 2013

(65) Prior Publication Data
US 2013/0063919 A1    Mar. 14, 2013

(30) Foreign Application Priority Data
Sep. 9, 2011    (CN) .......................... 2001 1 0267013

(51) Int. Cl.
*H05K 7/10*    (2006.01)
*H05K 7/12*    (2006.01)

(52) U.S. Cl.
USPC .......................................................... 361/767

(58) Field of Classification Search
USPC .......................... 361/767, 752, 808, 803, 784
See application file for complete search history.

(56) References Cited

U.S. PATENT DOCUMENTS

2005/0195578 A1*  9/2005  Chang et al. ................... 361/749
2008/0253101 A1*  10/2008  Takenaka et al. ............. 361/803

* cited by examiner

*Primary Examiner* — Timothy J Thompson
*Assistant Examiner* — Andargie M Aychillhum

(57) ABSTRACT

Disclosed is a liquid crystal display module comprising a display panel, and a plurality of panel lands is positioned on the display panel, and lengths of the panel lands extend along a straight direction of wire directions, and the module further comprise a flexible circuit board, and the flexible circuit board comprises a plurality of flexible circuit board lands, and the flexible circuit board lands are soldered with the panel lands one-to-one correspondingly. Two adjacent panel lands and corresponding flexible circuit board lands constitute a soldering unit, comprising a first panel land, a second panel land, a first flexible circuit board land corresponding to the first panel land and a second flexible circuit board land corresponding to the second panel land. The first panel land and the second panel land stagger transversely. The present invention also discloses a liquid crystal panel.

17 Claims, 6 Drawing Sheets

LIQUID CRYSTAL DISPLAY MODULE AND LIQUID CRYSTAL PANEL

BACKGROUND OF THE INVENTION

1. Field of the Invention

The present invention generally relates to a LCD technology field, and more particularly to a liquid crystal display module and a liquid crystal panel.

2. Description of Prior Art

With the unceasing development of the LCD technology, seriously high demand advances for the manufacture of the liquid crystal display.

Please refer to FIG. 1. FIG. 1 shows a diagram of soldering of a flexible circuit board (FPC) and a display panel according to prior arts.

The lengths and the widths of the panel lands 11 on the display panel are all the same. Moreover, the spaces L1 between the panel lands 11 are the same. Correspondingly, the lengths and the widths of the flexible circuit board land 12 on the flexible circuit board are the same.

With the resolution increase of the display panel, the widths of the panel lands 11 have to be increased. However, the spaces L1 between the panel lands 11 need to be narrowed down because of the restricted available land area.

Please refer to FIG. 2. FIG. 2 shows a diagram of soldering of panel lands 11 which the spaces therebetween are decreased. It is easy to tell from FIG. 2 that the spaces L1 between the panel lands 11 narrowed down and become too close, soldering precision may be likely decreased by soldering misalignment when the flexible circuit board land 12 is soldered to the panel land 11.

SUMMARY OF THE INVENTION

An objective of the present invention is to provide a liquid crystal display module to solve technical problems of soldering precision decreased by soldering misalignment when the flexible circuit board land is soldered to the panel land because the space between the panel lands are too small in prior arts.

For solving the aforesaid problems, the present invention provides a liquid crystal display module comprising a display panel, and a plurality of panel lands is positioned on the display panel, and lengths of the panel lands extend along a straight direction of wire directions, and the module further comprise a flexible circuit board, and the flexible circuit board comprises a plurality of flexible circuit board lands, and the flexible circuit board lands are soldered with the panel lands one-to-one correspondingly;

two adjacent panel lands and corresponding flexible circuit board lands constitute a soldering unit, comprising a first panel land, a second panel land, a first flexible circuit board land corresponding to the first panel land and a second flexible circuit board land corresponding to the second panel land;

wherein the first panel land and the second panel land stagger in a transverse direction perpendicular to the wire directions, and a width of the first panel land is smaller than a width of the second panel land;

the first panel land and the first flexible circuit board land, the second panel land and the second flexible circuit board land are connected with conductive adhesive.

In the liquid crystal display module of the present invention, a width of the first flexible circuit board land is larger than a width of the second flexible circuit board land.

In the liquid crystal display module of the present invention, the width of the first panel land is equal to the width of the second flexible circuit board land; the width of the second panel land is equal to the width of the first flexible circuit board land.

In the liquid crystal display module of the present invention, a space between the first flexible circuit board land and the second flexible circuit board land in the transverse direction is zero or the first flexible circuit board land and the second panel land are overlapped in the straight direction.

In the liquid crystal display module of the present invention, the first panel land comprises a first lower soldering section and a first upper soldering section;

the module further comprises a first panel wire and a second panel wire, and the first lower soldering section is connected with the first panel wire, and the first upper soldering section is connected with the second panel wire;

the second panel land comprises a second lower soldering section and a second upper soldering section;

the module further comprises a third panel wire and a fourth panel wire, and the second lower soldering section is connected with the third panel wire, and the second upper soldering section is connected with the fourth panel wire;

wherein the first panel wire and the third panel wire are positioned at the same side of the first panel land and the second panel land along the straight direction; and the first panel land and the fourth panel wire are located at the same side of the second panel land along the straight direction.

In the liquid crystal display module of the present invention, each of the first lower soldering section, the second lower soldering section, the first panel wire and the third panel wire comprises a first metal layer, a first insulation layer, a second metal layer and a second insulation layer from bottom to top, and a metal oxide layer is coated on the second insulation layer, and the metal oxide layer stretches downward to the first metal layer, and the first metal layer and the second metal layer are connected via the metal oxide layer.

In the liquid crystal display module of the present invention, each of the first upper soldering section, the second upper soldering section, the second panel wire and the fourth panel wire comprises the first metal layer, the first insulation layer and the second insulation layer from bottom to top.

Another objective of the present invention is to provide a liquid crystal display module to solve technical problems of soldering precision decreased by soldering misalignment when the flexible circuit board land is soldered to the panel land because the space between the panel lands are too small in prior arts.

For solving the aforesaid problems, the present invention provides a liquid crystal display module comprising a display panel, and a plurality of panel lands is positioned on the display panel, and lengths of the panel lands extend along a straight direction of wire directions, and the module further comprise a flexible circuit board, and the flexible circuit board comprises a plurality of flexible circuit board lands, and the flexible circuit board lands are soldered with the panel lands one-to-one correspondingly, characterized in that:

two adjacent panel lands and corresponding flexible circuit board lands constitute a soldering unit, comprising a first panel land, a second panel land, a first flexible circuit board land corresponding to the first panel land and a second flexible circuit board land corresponding to the second panel land;

wherein the first panel land and the second panel land stagger in a transverse direction perpendicular to the wire directions.

In the liquid crystal display module of the present invention, a width of the first panel land is smaller than a width of the second panel land.

In the liquid crystal display module of the present invention, a width of the first flexible circuit board land is larger than a width of the second flexible circuit board land.

In the liquid crystal display module of the present invention, the width of the first panel land is equal to the width of the second flexible circuit board land; the width of the second panel land is equal to the width of the first flexible circuit board land.

In the liquid crystal display module of the present invention, a space between the first flexible circuit board land and the second flexible circuit board land in the transverse direction is zero or the first flexible circuit board land and the second panel land are overlapped in the straight direction.

In the liquid crystal display module of the present invention, the first panel land comprises a first lower soldering section and a first upper soldering section;

the module further comprises a first panel wire and a second panel wire, and the first lower soldering section is connected with the first panel wire, and the first upper soldering section is connected with the second panel wire;

the second panel land comprises a second lower soldering section and a second upper soldering section;

the module further comprises a third panel wire and a fourth panel wire, and the second lower soldering section is connected with the third panel wire, and the second upper soldering section is connected with the fourth panel wire;

wherein the first panel wire and the third panel wire are positioned at the same side of the first panel land and the second panel land along the straight direction; and the first panel land and the fourth panel wire are located at the same side of the second panel land along the straight direction.

In the liquid crystal display module of the present invention, each of the first lower soldering section, the second lower soldering section, the first panel wire and the third panel wire comprises a first metal layer, a first insulation layer, a second metal layer and a second insulation layer from bottom to top, and a metal oxide layer is coated on the second insulation layer, and the metal oxide layer stretches downward to the first metal layer, and the first metal layer and the second metal layer are connected via the metal oxide layer.

In the liquid crystal display module of the present invention, each of the first upper soldering section, the second upper soldering section, the second panel wire and the fourth panel wire comprises the first metal layer, the first insulation layer and the second insulation layer from bottom to top.

In the liquid crystal display module of the present invention, the first panel land and the first flexible circuit board land, the second panel land and the second flexible circuit board land are connected with conductive adhesive.

Another objective of the present invention is to provide a liquid crystal display module to solve technical problems of soldering precision decreased by soldering misalignment when the flexible circuit board land is soldered to the panel land because the space between the panel lands are too small in prior arts.

For solving the aforesaid problems, the present invention provides a liquid crystal display panel comprising a plurality of panel lands positioned thereon, and lengths of the panel lands extend along a straight direction of wire directions, characterized in that: adjacent panel lands stagger in a transverse direction perpendicular to the wire directions.

Comparing with prior art, the present invention solves the technical problems of soldering precision decreased by soldering misalignment when the flexible circuit board land is soldered to the panel land because the space between the panel lands are too small in prior arts and promotes the soldering precision.

For a better understanding of the aforementioned content of the present invention, preferable embodiments are illustrated in accordance with the attached figures for further explanation:

DETAILED DESCRIPTION OF THE INVENTION

The following descriptions for the respective embodiments are specific embodiments capable of being implemented for illustrations of the present invention with referring to appended figures.

Figure 1:
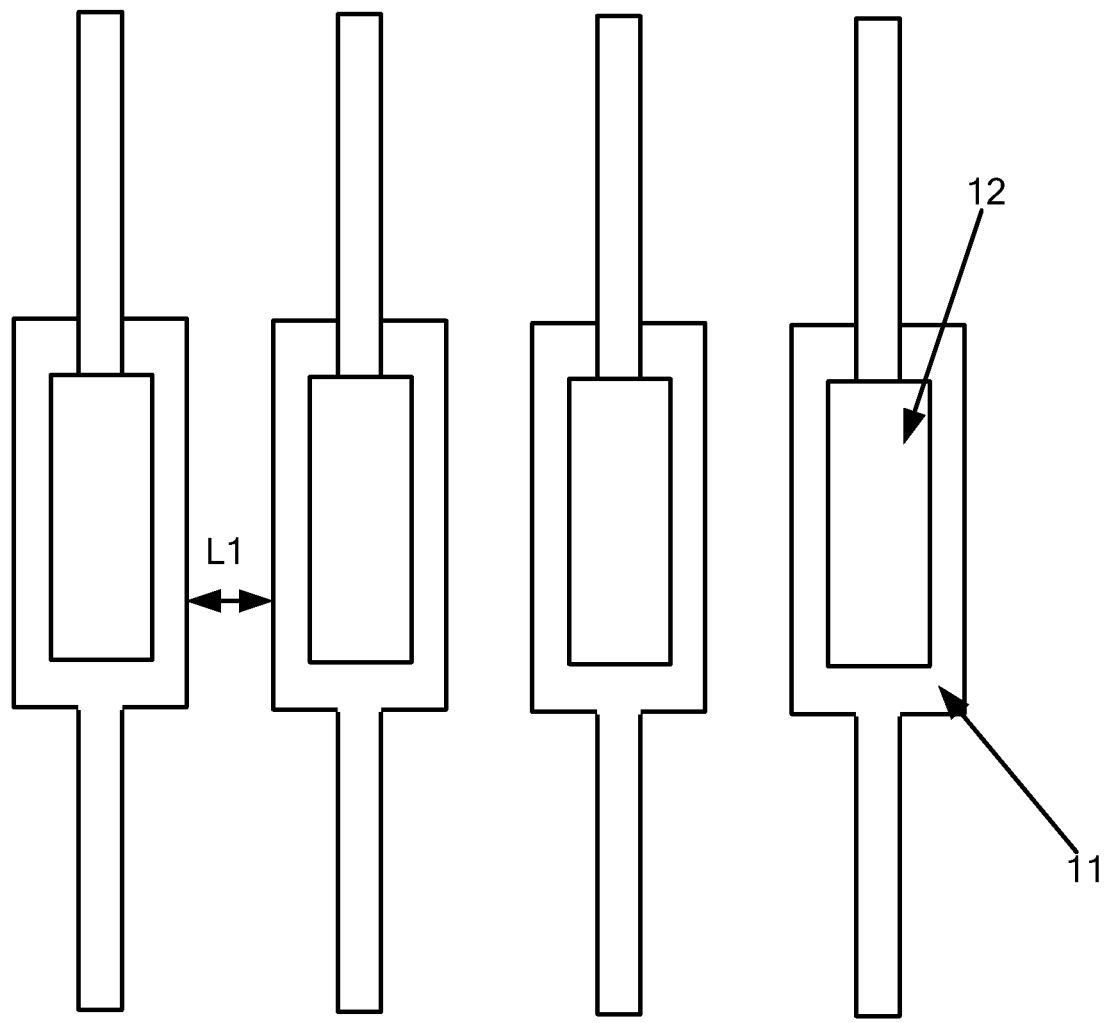
FIG. 1 shows a diagram of soldering of a flexible circuit board and a display panel according to prior arts.
Figure 2:
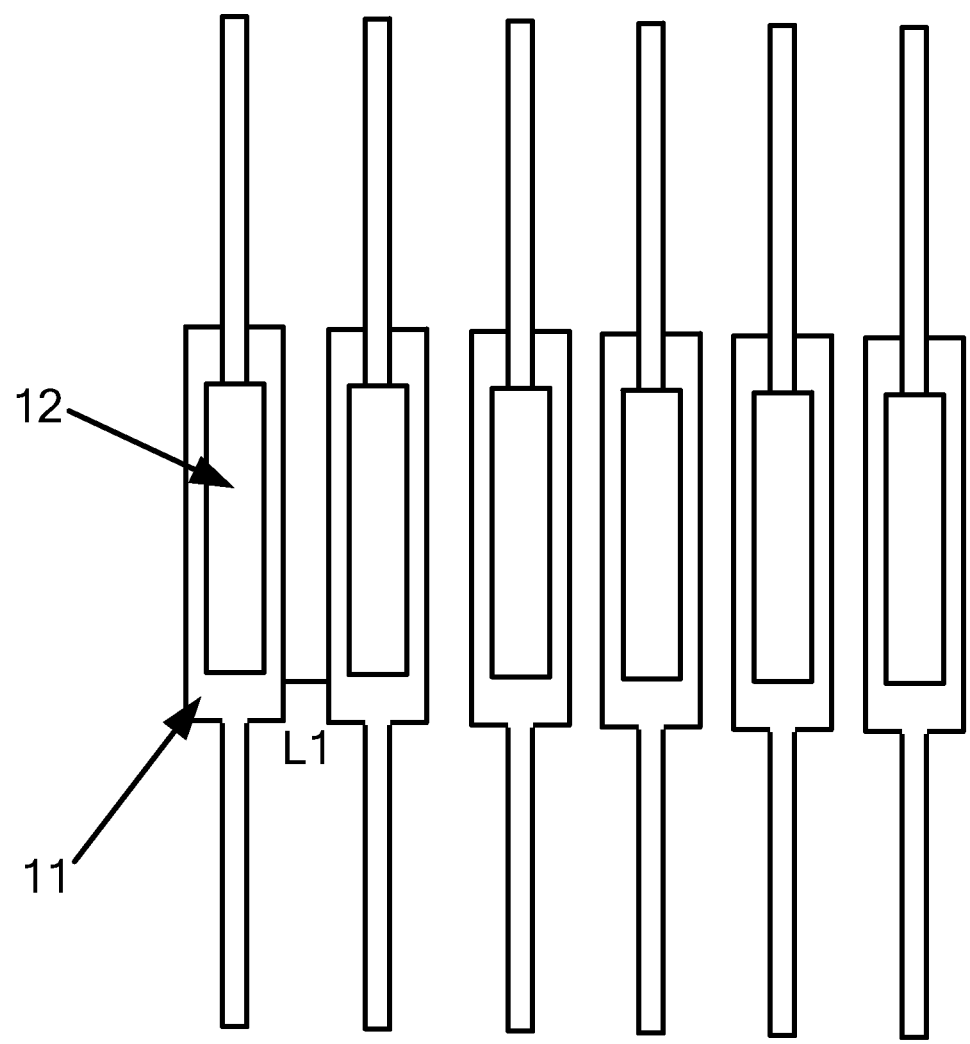
FIG. 2 shows a diagram of soldering of panel lands which the spaces therebetween are decreased.
Figure 3:
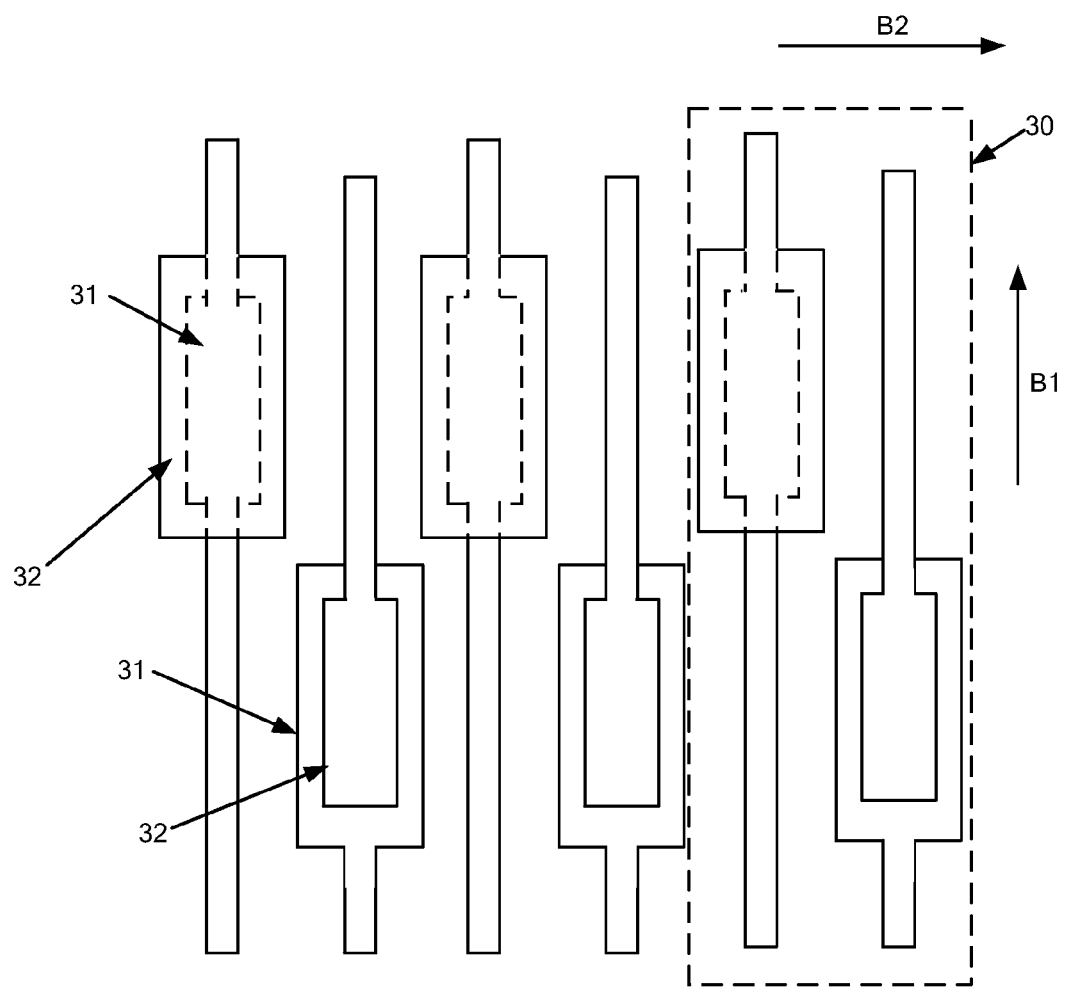
FIG. 3 shows a structure diagram of a liquid crystal display module according to a preferable embodiment of the present invention.

FIG. 3 shows a structure diagram of a liquid crystal display module according to a preferable embodiment of the present invention.

Please refer to FIG. 3. The liquid crystal display module comprises a display panel (now shown). A plurality of panel lands 31 is positioned on the display panel. Lengths of the panel lands 31 extend along a straight direction B1 of wire directions. The liquid crystal display module further comprises a flexible circuit board (not shown). The flexible circuit board comprises a plurality of flexible circuit board lands 32. The flexible circuit board lands 32 are soldered with the panel lands 31 one-to-one correspondingly.

Figure 4:
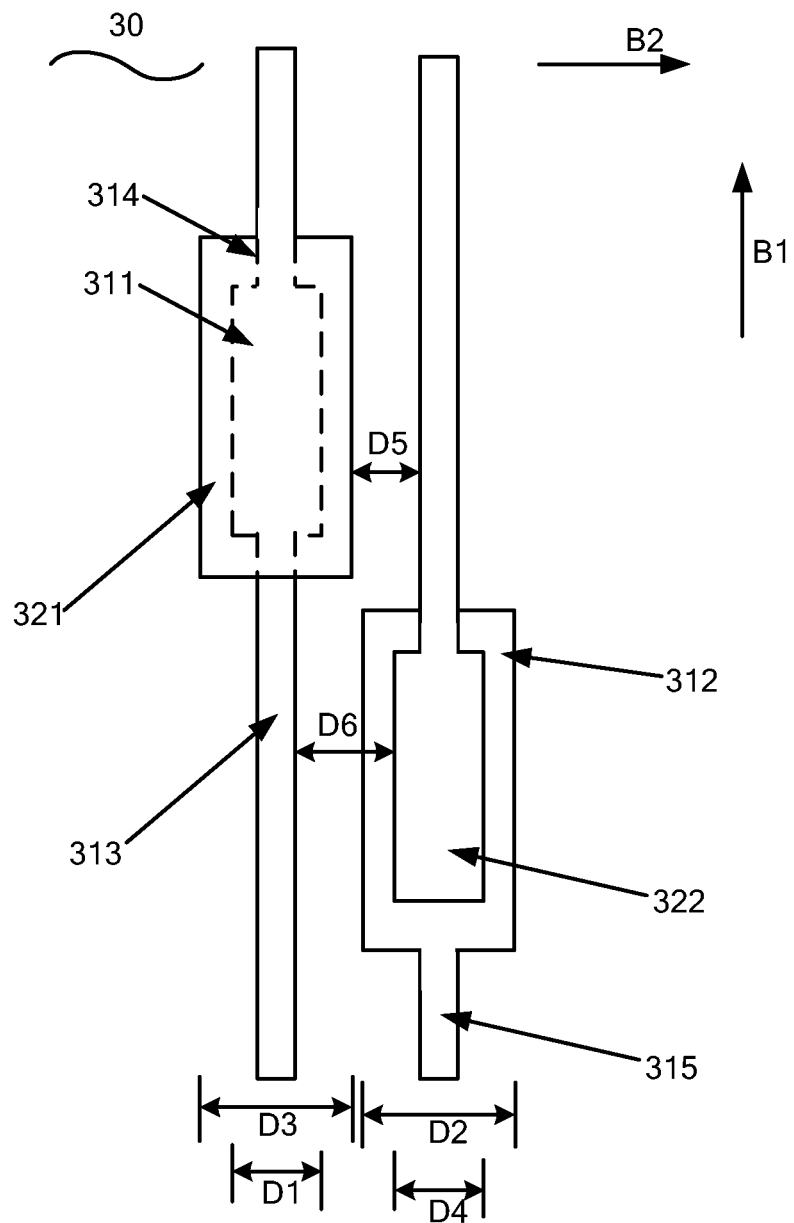
FIG. 4 shows a structure diagram of a soldering unit in a liquid crystal display module according to a preferable embodiment of the present invention.

Please refer to FIG. 3 and FIG. 4. Two adjacent panel lands and corresponding flexible circuit board lands constitute a soldering unit 30. Soldering units 30 are arranged along a transverse direction B2 perpendicular to the wire directions B1. Each of soldering unit 30 comprises a first panel land 311, a second panel land 312, a first flexible circuit board land 321 corresponding to the first panel land 311 and a second flexible circuit board land 322 corresponding to the second panel land 312.

Please refer to FIG. 4. The first panel land 311 and the second panel land 312 stagger in the transverse direction B2. Correspondingly, the first flexible circuit board land 321 and the second flexible circuit board land 322 stagger in the transverse direction B2, too.

Please refer to FIG. 4. A width D1 of the first panel land 311 is smaller than a width D2 of the second panel land 312. Correspondingly, a width D3 of the first flexible circuit board land 321 is larger than a width D4 of the second flexible circuit board land 322.

Certainly, the positions of the first panel land 311 and the second panel land 312 can be exchanged in a specific embodiment. The working principle is similar to the embodiment shown in FIG. 4 and the detail descriptions are omitted herein.

In the embodiment shown in FIG. 4, the width D1 of the first panel land 311 is equal to the width D4 of the second flexible circuit board land 322 and the width D2 of the second panel land 312 is equal to the width D3 of the first flexible circuit board land 321.

Certainly, the four widths D1, D2, D3 and D4 can be flexibly deployed in a specific embodiment as long as the soldering area is adequately utilized. The detail description is omitted herein.

In the embodiment shown in FIG. 4, the first flexible circuit board land 321 covers the first panel land 311 and the second flexible circuit board land 322 is positioned on the second panel land 312 because the width D2 of the second panel land 312 equals to the width D3 of the first flexible circuit board land 321. Accordingly, the soldering areas of upper soldering lands in the two rows can be guaranteed to be equivalent to ensure the consistency of the contact resistances.

In the embodiment shown in FIG. 4, a space between the first flexible circuit board land 321 and the second flexible circuit board land 312 in the transverse direction B2 is zero. Alternatively, the first flexible circuit board land 312 and the second panel land 312 are overlapped in the straight direction B1 to ensure the adequately utilization of the soldering areas. Certainly, the space between the first flexible circuit board land 321 and the second flexible circuit board land 312 in the transverse direction B2 can be infinitesimal as long as the soldering area is adequately utilized. The detail description is omitted herein.

Figure 5:
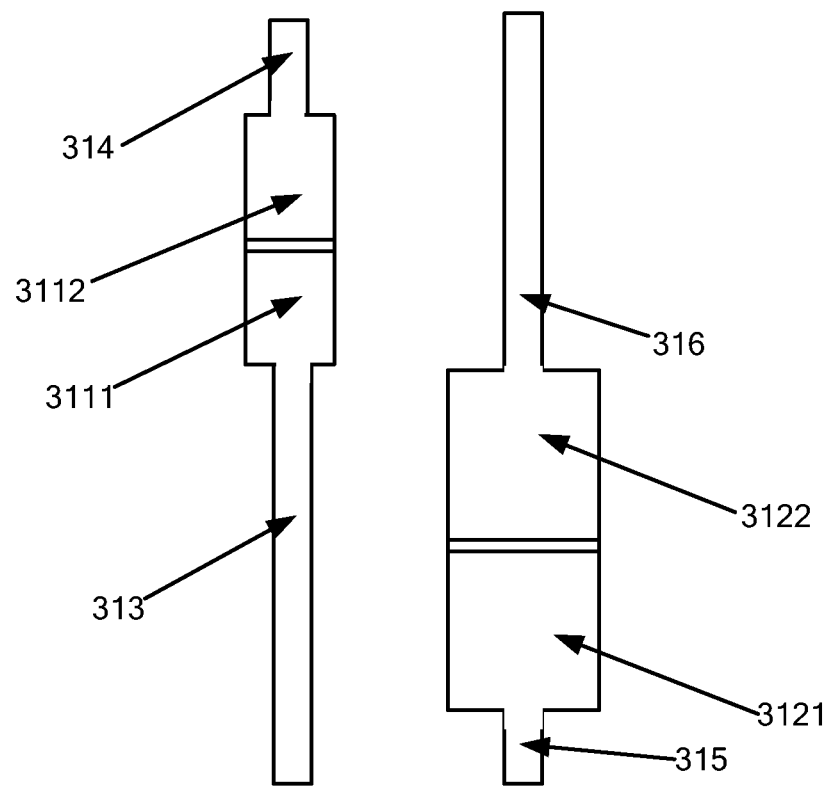
FIG. 5 shows a structure diagram of a first panel land and a second panel land according to a preferable embodiment of the present invention.

Please refer to FIG. 4 and FIG. 5. FIG. 5 shows a structure diagram of a first panel land 311 and a second panel land 312 according to a preferable embodiment of the present invention. The first panel land 311 comprises a first lower soldering section 3111 and a first upper soldering section 3112. The module further comprises a first panel wire 313 and a second panel wire 314, and the first lower soldering section 3111 is connected with the first panel wire 313, and the first upper soldering section 3112 is connected with the second panel wire 314.

The second panel land 312 comprises a second lower soldering section 3121 and a second upper soldering section 3122; The module further comprises a third panel wire 315 and a fourth panel wire 316, and the second lower soldering section 3121 is connected with the third panel wire 315, and the second upper soldering section 3122 is connected with the fourth panel wire 316.

The first panel wire 313 and the third panel wire 315 are positioned at the same side of the first panel land 311 and the second panel land 312 along the straight direction B1; the first panel land 311 and the fourth panel wire 316 are located at the same side of the second panel land 312 along the straight direction B1. A space between the first flexible circuit board land 321 and the fourth panel wire 316 is denoted by D5. A space between the second flexible circuit board land 322 and the first panel wire 313 is denoted by D6.

Figure 6A:
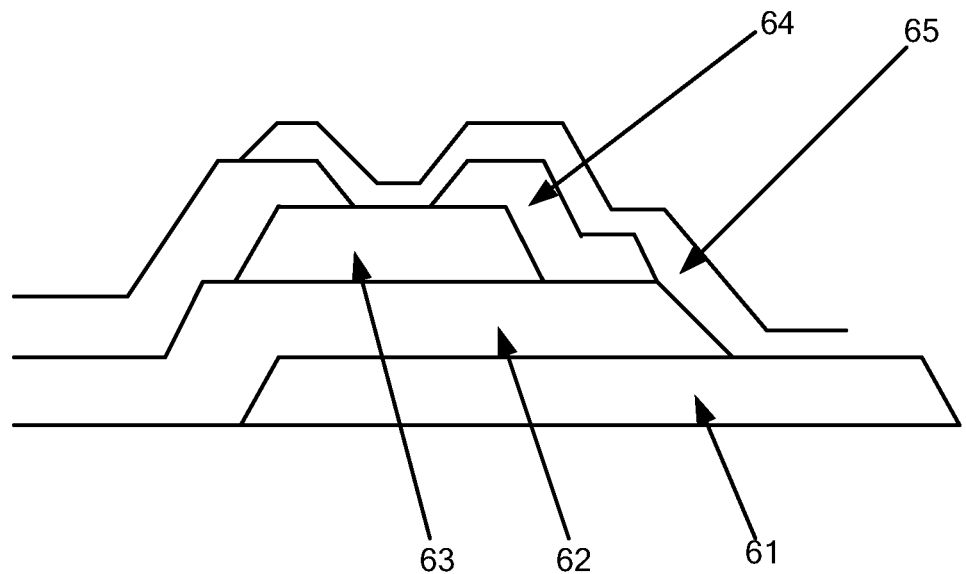
FIG. 6A and FIG. 6B show sectional diagrams of a panel land and a panel wire according to a preferable embodiment of the present invention.

Please refer to FIG. 6A. Each of the first lower soldering section 3111, the second lower soldering section 3121, the first panel wire 313 and the third panel wire 315v comprises a first metal layer 61, a first insulation layer 62, a second metal layer 63 and a second insulation layer 64 from bottom to top. A metal oxide layer 65 is coated on the second insulation layer 62. The metal oxide layer 65 comprises metal oxide, such as ITO (Indium Tin Oxides). The metal oxide layer 65 stretches downward to the first metal layer 61. The first metal layer 61 and the second metal layer 63 are connected via the metal oxide layer 65.

Figure 6B:
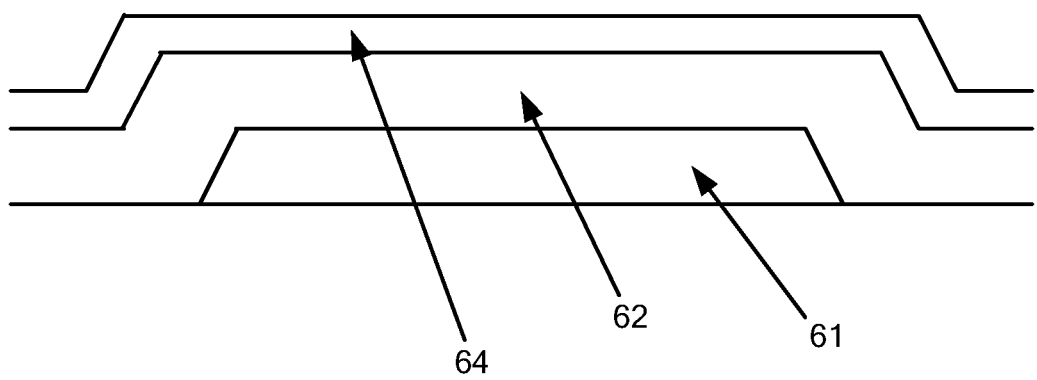

Please refer to FIG. 6B. Each of the first upper soldering section 3112, the second upper soldering section 3122, the second panel wire 314 and the fourth panel wire 316 comprises the first metal layer 61, the first insulation layer 62 and the second insulation layer 64 from bottom to top.

In a specific embodiment, the first panel land 311 and the first flexible circuit board land 321, the second panel land 312 and the second flexible circuit board land 322 are connected with conductive adhesive (not shown).

In a specific embodiment, each of the first panel land 311, the first flexible circuit board land 321, the second panel land 312 and the second flexible circuit board land 322 comprises a connecting hole (not shown) thereon. The first panel land 311 and the first flexible circuit board land 321 are aligned with the corresponding holes. The second panel land 312 and the second flexible circuit board land 322 are aligned with the corresponding holes.

The working principle of the preferable embodiment according to the present invention is introduced below:

Please refer to FIG. 3. When a flexible circuit board land 32 is soldered with a panel land 31 by taking a soldering unit 30 shown in FIG. 4 as an example, conductive adhesive is coated on the surfaces of the first panel land 311 and the second panel land 312 in the first place.

After that, the first flexible circuit board land 321 is pressed on the first panel land 311 and the second flexible circuit board land 322 is pressed on the second panel land 312.

When the alignment is proceeded, the misalignment occurrences can be effectively prevented because the first panel land 311 and the second panel land 312 stagger with each other in the transverse direction B2, and the first flexible circuit board land 321 and the second flexible circuit board land 322 also stagger with each other in the transverse direction B2.

Furthermore, the first panel wire 311 and the fourth panel wire 316 are positioned at the same side of the second panel land 312 along the straight direction B1 and the fourth panel wire 316 comprises the first insulation layer 62 and the second insulation layer 64 (in FIG. 6). Therefore, when the first flexible circuit board land 321 is aligned and pressed on the first panel land 311, even a shift distance of misalignment is larger than the space D5 and results in that the first flexible circuit board land 321 is pressed on the fourth panel wire 316, the conducting particle cannot reach the first metal layer 61 and effectively prevent the phenomenon of the abnormal signal transmission because the fourth panel wire 316 comprises two insulation layers, the first insulation layer 62 and the second insulation layer 64 and the thickness is larger.

When the second flexible circuit board land 322 is pressed on the second panel land 312, the second panel land 312 is closer to the first panel wire 313. Therefore, although, the first panel wire 313 merely comprises the second insulation layer 64 and the space D6 between the second flexible circuit board land 322 and the first panel wire 313 is larger, a shift distance of misalignment will never be larger than the space D6 and the flexible circuit board lands 32 will not be pressed on the first panel wire 313. The phenomenon of the abnormal signal transmission can be effectively prevented.

The present invention also provides a liquid crystal panel. The liquid crystal panel comprises a plurality of panel lands positioned thereon. Lengths of the panel lands extend along a straight direction of wire directions and adjacent panel lands stagger in a transverse direction perpendicular to the wire directions. As aforementioned, the soldering of the liquid crystal panel and the flexible circuit board is described. Further explanation for the liquid crystal panel is omitted herein.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A liquid crystal display module comprising a display panel, and a plurality of panel lands is positioned on the display panel, and lengths of the panel lands extend along a straight direction of wire directions, and the liquid crystal display module further comprise a flexible circuit board, and the flexible circuit board comprises a plurality of flexible circuit board lands, and the flexible circuit board lands are soldered with the panel lands one-to-one correspondingly, characterized in that:

two adjacent panel lands and corresponding flexible circuit board lands constitute a soldering unit, comprising a first panel land, a second panel land, a first flexible circuit board land corresponding to the first panel land and a second flexible circuit board land corresponding to the second panel land;

wherein the first panel land and the second panel land stagger in a transverse direction perpendicular to the wire directions, and a width of the first panel land is smaller than a width of the second panel land;

the first panel land and the first flexible circuit board land, the second panel land and the second flexible circuit board land are connected with conductive adhesive.

2. The liquid crystal display module of claim 1, characterized in that a width of the first flexible circuit board land is larger than a width of the second flexible circuit board land.

3. The liquid crystal display module of claim 2, characterized in that the width of the first panel land is equal to the width of the second flexible circuit board land; the width of the second panel land is equal to the width of the first flexible circuit board land.

4. The liquid crystal display module of claim 3, characterized in that a space between the first flexible circuit board land and the second flexible circuit board land in the transverse direction is zero or the first flexible circuit board land and the second panel land are overlapped in the straight direction.

5. The liquid crystal display module of claim 1, characterized in that, the first panel land comprises a first lower soldering section and a first upper soldering section;

the module further comprises a first panel wire and a second panel wire, and the first lower soldering section is connected with the first panel wire, and the first upper soldering section is connected with the second panel wire;

the second panel land comprises a second lower soldering section and a second upper soldering section;

the module further comprises a third panel wire and a fourth panel wire, and the second lower soldering section is connected with the third panel wire, and the second upper soldering section is connected with the fourth panel wire;

wherein the first panel wire and the third panel wire are positioned at the same side of the first panel land and the second panel land along the straight direction; and the first panel land and the fourth panel wire are located at the same side of the second panel land along the straight direction.

6. The liquid crystal display module of claim 5, characterized in that, each of the first lower soldering section, the second lower soldering section, the first panel wire and the third panel wire comprises a first metal layer, a first insulation layer, a second metal layer and a second insulation layer from bottom to top, and a metal oxide layer is coated on the second insulation layer, and the metal oxide layer stretches downward to the first metal layer, and the first metal layer and the second metal layer are connected via the metal oxide layer.

7. The liquid crystal display module of claim 6, characterized in that, each of the first upper soldering section, the second upper soldering section, the second panel wire and the fourth panel wire comprises the first metal layer, the first insulation layer and the second insulation layer from bottom to top.

8. A liquid crystal display module comprising a display panel, and a plurality of panel lands is positioned on the display panel, and lengths of the panel lands extend along a straight direction of wire directions, and the module further comprise a flexible circuit board, and the flexible circuit board comprises a plurality of flexible circuit board lands, and the flexible circuit board lands are soldered with the panel lands one-to-one correspondingly, characterized in that:

two adjacent panel lands and corresponding flexible circuit board lands constitute a soldering unit, comprising a first panel land, a second panel land, a first flexible circuit board land corresponding to the first panel land and a second flexible circuit board land corresponding to the second panel land;

wherein the first panel land and the second panel land stagger in a transverse direction perpendicular to the wire directions.

9. The liquid crystal display module of claim 8, characterized in that a width of the first panel land is smaller than a width of the second panel land.

10. The liquid crystal display module of claim 9, characterized in that a width of the first flexible circuit board land is larger than a width of the second flexible circuit board land.

11. The liquid crystal display module of claim 10, characterized in that the width of the first panel land is equal to the width of the second flexible circuit board land; the width of the second panel land is equal to the width of the first flexible circuit board land.

12. The liquid crystal display module of claim 11, characterized in that a space between the first flexible circuit board land and the second flexible circuit board land in the transverse direction is zero or the first flexible circuit board land and the second panel land are overlapped in the straight direction.

13. The liquid crystal display module of claim 8, characterized in that the first panel land comprises a first lower soldering section and a first upper soldering section;

the module further comprises a first panel wire and a second panel wire, and the first lower soldering section is connected with the first panel wire, and the first upper soldering section is connected with the second panel wire;

the second panel land comprises a second lower soldering section and a second upper soldering section;

the module further comprises a third panel wire and a fourth panel wire, and the second lower soldering section is connected with the third panel wire, and the second upper soldering section is connected with the fourth panel wire;

wherein the first panel wire and the third panel wire are positioned at the same side of the first panel land and the second panel land along the straight direction; and the first panel land and the fourth panel wire are located at the same side of the second panel land along the straight direction.

14. The liquid crystal display module of claim 13, characterized in that each of the first lower soldering section, the second lower soldering section, the first panel wire and the third panel wire comprises a first metal layer, a first insulation layer, a second metal layer and a second insulation layer from bottom to top, and a metal oxide layer is coated on the second insulation layer, and the metal oxide layer stretches downward to the first metal layer, and the first metal layer and the second metal layer are connected via the metal oxide layer.

15. The liquid crystal display module of claim 14, characterized in that, each of the first upper soldering section, the second upper soldering section, the second panel wire and the fourth panel wire comprises the first metal layer, the first insulation layer and the second insulation layer from bottom to top.

16. The liquid crystal display module of claim 8, characterized in that, the first panel land and the first flexible circuit board land, the second panel land and the second flexible circuit board land are connected with conductive adhesive.

17. A liquid crystal display panel comprising a plurality of panel lands positioned thereon, and lengths of the panel lands extend along a straight direction of wire directions, characterized in that: adjacent panel lands stagger in a transverse direction perpendicular to the wire directions.

\* \* \* \* \*